(12) United States Patent
Zu et al.

(10) Patent No.: US 8,647,522 B2
(45) Date of Patent: Feb. 11, 2014

(54) METHODS OF WET ETCHING A SELF-ASSEMBLED MONOLAYER PATTERNED SUBSTRATE AND METAL PATTERNED ARTICLES

(75) Inventors: Lijun Zu, Woodbury, MN (US); Matthew H. Frey, Cottage Grove, MN (US); Myungchan Kang, Woodbury, MN (US); Jeffrey H. Tokie, Scandia, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 13/319,704

(22) PCT Filed: Jun. 17, 2010

(86) PCT No.: PCT/US2010/038942
§ 371 (c)(1),
(2), (4) Date: Nov. 10, 2011

(87) PCT Pub. No.: WO2010/151471
PCT Pub. Date: Dec. 29, 2010

(65) Prior Publication Data
US 2012/0082825 A1 Apr. 5, 2012

Related U.S. Application Data

(60) Provisional application No. 61/220,407, filed on Jun. 25, 2009.

(51) Int. Cl.
*C23F 1/02* (2006.01)
*G03F 7/26* (2006.01)

(52) U.S. Cl.
USPC ............................ 216/41; 430/322; 428/195.1

(58) Field of Classification Search
USPC ........... 430/311, 313, 318; 428/195.1; 216/41
See application file for complete search history.

(56) References Cited

U.S. PATENT DOCUMENTS

| 1,313,233 | A | 8/1919 | Grass |
| 3,483,049 | A | 12/1969 | Grubbe |

(Continued)

FOREIGN PATENT DOCUMENTS

| DE | 2030304 | 12/1971 |
| DE | 2353936 | 5/1975 |
| GB | 1080536 | 8/1967 |

OTHER PUBLICATIONS

Wilbur et al., "Microcontact printing of self-assembled monolayers: applications in microfabrication", Nanotechnology 7 (1996) 452-457.*

(Continued)

*Primary Examiner* — Brittany Richmond
(74) *Attorney, Agent, or Firm* — Adrian L. Pishko

(57) ABSTRACT

Method of patterning a substrate are described including a method of providing a substrate comprising a metalized surface having a self-assembled monolayer patterned region and unpatterned region; and wet etching the metalized surface in a liquid etchant agitated with bubbling gas to remove metal from the unpatterned regions to form a metal pattern. Also described are metal patterned article including an article comprising a substrate and an etched microcontact printed metal pattern disposed on the substrate wherein the pattern has a thickness of at least 100 nanometers and a pattern feature uniformity of at least 50% for an area of at least 25 $cm^2$.

24 Claims, 2 Drawing Sheets

(56) References Cited

U.S. PATENT DOCUMENTS

| | | | |
|---|---|---|---|
| 3,565,707 | A | 2/1971 | Radimer |
| 4,602,184 | A * | 7/1986 | Meitzler ................ 310/322 |
| 6,518,168 | B1 | 2/2003 | Clem |
| 2002/0190028 | A1* | 12/2002 | Srivastava et al. .......... 216/90 |
| 2004/0053009 | A1* | 3/2004 | Ozin et al. ............... 428/168 |
| 2008/0095985 | A1 | 4/2008 | Frey |
| 2009/0218310 | A1 | 9/2009 | Zu |
| 2009/0219257 | A1 | 9/2009 | Frey |
| 2009/0219258 | A1 | 9/2009 | Geaghan |
| 2010/0156840 | A1 | 6/2010 | Frey |
| 2011/0104840 | A1* | 5/2011 | Burdinski et al. .......... 438/34 |
| 2011/0226733 | A1 | 9/2011 | Zu |

OTHER PUBLICATIONS

Geissler et al., "Selective wet-etching of microcontact-printed Cu substrates with control over the etch profile"; Microelectronic Engineering vol. 67-68, (2003) 326-332.

Kumar et al., "Features of gold having micrometer to centimeter dimensions can be formed through a combination of stamping with an elastomeric stamp and an alkanethiol "ink" followed by chemical etching", Appl. Phys. Lett. vol. 63 No. 14, Oct. 4, 1993, pp. 2002-2004.

Xia et al., "Microcontact Printing of Alkanethiols on Silver and Its Application in Microfabrication", J. Electrochem. Soc., vol. 143, No. 3, Mar. 1996, pp. 1070-1079.

Bass et al., "Microcontact printing with octadecanethiol"; Applied Surface Science 226 (2004) 335-340.

Delamarche et al., "Transport Mechanisms of Alkanethiols during Microcontact Printing on Gold"; The Journal of Physical Chemistry B; 1998, 102 (18), 3324-3334.

Geissler et al., Fabrication of Metal Nanowires Using Microcontact Printing:; Langmuir 2003, vol. 19, 6301-6311.

Xia et al., "A Selective Etching Solution for Use with Patterned Self-Assembled Monolayers of Alkanethiolates on Gold"; Chemistry of Materials, 1995, vol. 7, pp. 2332-2337.

Xia et al., "Microcontact Printing of Alkanethiols on Copper and Its Application in Microfabrication"; Chemistry of Materials, 1996, vol. 8, pp. 601-603.

Xia et al., "Use of Electroless Silver as the Substrate in Microcontact Printing of Alkanethiols and Its Application in Microfabrication", Langmuir, 1998, vol. 14, 363-371.

Kumar et al., "Patterning Self-Assembled Monolayers: Applications in Materials Science", Langmuir 1994, 10, 1498-1511.

Xia et al., "Pattern transfer: Self-assembled monolayers as ultrathin resists" Microelectronic Engineering 32 (1996) 265-268.

Xia et al., "Soft Lithography", Angew. Chem. Int. Ed. 1998, 37, 550-575.

Ag-Silber—Nassätzen, Michael Köhler: "Ätzverfahren für die Mikrotechnik" Jan. 19, 1998; ISBN: 3-527-28869, pp. 210-211.

International Search Report PCT/US2010/038942,Aug. 12, 2010, 5 pages.

Kumar, et al., "The Use of Self-Assembled Monolayers and a Selective Etch to Generate Patterned Gold Features," J. Am. Chem. Soc., vol. 114, pp. 9188-9189, 1992.

* cited by examiner

METHODS OF WET ETCHING A SELF-ASSEMBLED MONOLAYER PATTERNED SUBSTRATE AND METAL PATTERNED ARTICLES

CROSS REFERENCE TO RELATED APPLICATIONS

This application is a national stage filing under 35 U.S.C. 371 of PCT/US2010/038942, filed Jun. 17, 2010, which claims priority to U.S. Provisional Application No. 61/220,407, filed Jun. 25, 2009, the disclosure of which is incorporated by reference in its entirety herein.

BACKGROUND

Microcontact printing uses micropatterned elastomeric stamps, typically made from polydimethyl siloxane (PDMS) that are inked and placed onto a substrate to localize a chemical reaction between molecules of the ink that are able to form a self-assembled monolayer (SAM) and the substrate. The patterned SAM resulting from such technique have served as resists for selectively etching metal and metalized substrates, to form electrically conductive patterns.

SUMMARY

Although various etchant processes have been described in the literature, industry would find advantage in methods amenable to producing metal patterns having improved uniformity and/or increased thickness, particularly over relatively large areas. Industry would also find advantage in etching methods having increased etch rates, thereby increasing manufacturing efficiency.

In some embodiments, methods of wet etching a SAM patterned metalized substrate are described.

In one embodiment, a method of patterning a substrate is described comprising providing a substrate comprising a metalized surface having a self-assembled monolayer patterned region and unpatterned region; and wet etching the metalized surface in a liquid etchant agitated with bubbling gas to remove metal from the unpatterned regions to form a metal pattern.

In another embodiment, a method of patterning a substrate is described comprising providing a substrate comprising a metalized surface having a self-assembled monolayer patterned region and unpatterned region; and wet etching the substrate at a rate of at least 300 nm/minute to remove metal from the unpatterned regions thereby forming a metal pattern.

In each of the embodied methods, the self-assembled monolayer patterned region is typically microcontact printed onto the metalized surface. Bubbles are preferably emitted from the bubble generating surface move through the liquid etchant in a direction substantially normal to the metalized surface. The bubbles preferably impinge upon the metalized surface comprising the patterned self-assembled monolayer.

In some embodiments, the metalized surface comprising the self-assembled monolayer patterned region is positioned substantially parallel to a bubble generating surface that emits bubbles. The metalized surface may be positioned at a distance of at least 30 millimeters from the bubble generating surface. Further, the bubble generating surface typically has surface area of at least about ¼ of that of the self-assembled monolayer pattern. The bubbles emitted from the bubble generating surface have a velocity of at least 10 cm/min. Further, the bubbles typically have a diameter of at least 2 millimeters at the metalized surface.

The methods are amenable to producing various patterned articles.

In one embodiment, a patterned article is described comprising a substrate and an etched microcontact printed metal pattern disposed on the substrate wherein the pattern has a thickness of at least 100 nanometers and a pattern feature uniformity of at least 50%, 75%, or 90% throughout an area of at least 25 cm$^2$.

In another embodiment, a patterned article is described comprising a substrate and an etched microcontact printed metal pattern disposed on the substrate; wherein the pattern comprises silver or gold having a thickness of at least 250 nanometers.

DETAILED DESCRIPTION

Figure 1:
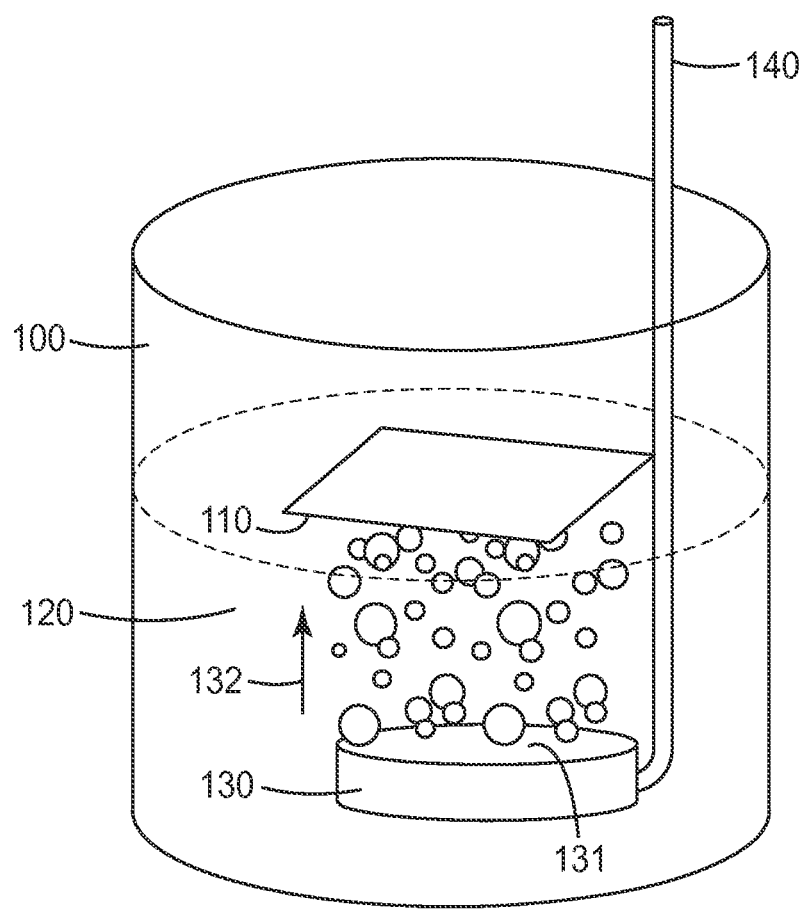
FIG. 1 is a schematic depicting etching an SAM patterned metalized substrate in an etchant bath agitated with gas bubbling.

Definitions
As used in this patent application:
"self-assembled monolayer" generally refers to a layer of molecules that are attached (e.g., by a chemical bond) to a surface and that have adopted a preferred orientation with respect to that surface and even with respect to each other. Self-assembled monolayers have been shown to cover surfaces so completely that the properties of that surface are changed. For example, application of a self-assembled monolayer can result in a surface energy reduction and allow selective etching of metal that is not coated with the self-assembled monolayer.

"etchant" means a material (e.g., liquid) for removing the metal from unpatterned regions by chemical reaction, dissolution, or a combination thereof (for example, by contacting the material with a wet chemical solution that dissolves the metal or reacts with the metal to yield soluble products);

"thio" means a divalent group or moiety of formula —S—.

The present disclosure relates to methods of wet etching the metal of a substrate comprising a metalized surface having unpatterned regions and a patterned self-assembled monolayer (SAM). The patterned SAM functions as an etch resist and is typically microcontact printed onto the metalized surface.

The invention is generally useful for any metal or metalized substrate. As used herein, "metal" and "metalized" refers to an elemental metal or alloy that is suitably conductive for the intended purpose.

Although the method and articles described herein could employ an opaque substrate such as a silicon wafer, in preferred embodiments, the metalized substrate is typically a metal-coated visible light transparent substrate.

As used herein, "visible light transparent" refers to the level of transmission of unmetalized regions of the substrate being typically at least 80% transmissive to at least one polarization state of visible light, where the % transmission is normalized to the intensity of the incident, optionally polarized light. The regions of the substrate that comprise the (e.g. microcontact printed) metal pattern typically have a lower transmission. Typically, the average transmittance of the substrate with an etched microcontact printed metal pattern thereon, including both the patterned (i.e. metalized) and unpatterned (i.e., unmetalized) regions, is at least 60%.

Common visible light transparent substrates include glass and polymeric films. A polymeric "film" substrate is a polymer material in the form of a flat sheet that is sufficiently flexible and strong to be processed in a roll-to-roll fashion. By roll-to-roll, what is meant is a process where material is wound onto or unwound from a support, as well as further processed in some way. Examples of further processes include coating, slitting, blanking, and exposing to radiation, or the like. Polymeric films can be manufactured in a variety of thickness, ranging in general from about 5 µm to 1000 µm. In many embodiments, polymeric film thicknesses range from about 25 µm to about 500 µm, or from about 50 µm to about 250 µm, or from about 75 µm to about 200 µm. Roll-to-roll polymeric films may have a width of at least 12 inches, 24 inches, 36 inches, or 48 inches.

Useful polymeric films include thermoplastic and thermoset polymeric films. Examples of thermoplastics include polyolefins, polyacrylates, polyamides, polyimides, polycarbonates, and polyesters. Further examples of thermoplastics include polyethylene, polypropylene, poly(methylmethacrylate), polycarbonate of bisphenol A, poly(vinyl chloride), polyethylene terephthalate, and poly(vinylidene fluoride).

The (e.g. polymeric film) substrate has a metallic coating disposed on at least one major surface. The surface of a substrate with a metallic coating disposed thereon is described herein as a metalized surface of a substrate. The metallic coating is typically a continuous metal coating that is then SAM patterned metal regions are retained on the substrate and the metal of the unpatterned regions is removed by wet etching, thereby forming a metal pattern.

The metallic coating can be deposited using any convenient method, for example sputtering, evaporation, chemical vapor deposition, or chemical solution deposition (including electroless plating).

The metallic coating comprises elemental metal, metal alloys, intermetallic compounds, metal oxides, metal sulfides, metal carbides, metal nitrides, or combinations thereof. Exemplary metals include gold, silver, palladium, platinum, rhodium, copper, nickel, iron, indium, tin, tantalum, as well as mixtures, alloys, and compounds of these elements.

The metallic coatings can be various thicknesses. However, the thickness of the resulting conductive pattern is generally equal to the thickness of the metallic coating. Although the method of the present invention can also be used for relatively thin patterns, ranging in thickness from about 5 nanometers to about 50 nanometers, the methods described herein are particularly amenable to articles having increased metal pattern thicknesses, of at least 60 nm, 70 nm, 80 nm, 90 nm, or 100 nm. In some embodiments, the thickness of the (e.g. conductive) metal pattern is at least 250 nm. In some embodiments, the silver micropatterns have thicknesses of at least 300 nm, 400 nm, 500 nm, 600 nm, 700 nm, 800 nm, 900 nm, and even 1000 nm or greater. The other embodiments, the gold micropatterns have thicknesses of at least 300 nm, 350 nm, 400 nm, or greater.

If desired, the metalized substrate surfaces can be treated by any of a number of different processes prior to application of the ink. Examples of optional treatment processes include ultraviolet light-ozone cleaning, oxygen plasma cleaning, solvent degreasing, high-pressure washing, and detergent-based cleaning Patterning functionalizing molecules to generate a self-assembled monolayer pattern can be achieved using a number of different techniques, including microcontact printing, dip-pen nanolithography, photolithography, and ink jet printing.

As used herein, a self-assembled monolayer patterned region is a portion of a metalized surface where a self-assembled monolayer exists (e.g. as applied by microcontact printing). As used herein, an unpatterned region is a portion of a metalized surface where the self-assembled monolayer of the patterned region does not exist. It is within the scope of the invention for a different self-assembled monolayer to exist in the unpatterned region, provided that the presence thereof does not interfere with the etching.

Microcontact printing typically utilizes a relief-patterned elastomeric stamp. Useful elastomers for forming the stamp include silicones, polyurethanes, ethylene propylene diene M-class (EPDM) rubbers, as well as the range of existing commercially available flexographic printing plate materials (for example, commercially available from E.I. du Pont de Nemours and Company, Wilmington, Del., under the trade name Cyrel™). The stamp can be made from a composite material (for example, one of the aforementioned elastomers combined with a woven or non-woven fibrous reinforcement).

Polydimethylsiloxane (PDMS) is particularly useful as a stamp material, as it is elastomeric and has a low surface energy (which makes it easy to remove the stamp from most substrates). PDMS is also commercially available. A useful commercially available formulation is Sylgard™ 184 PDMS (Dow Corning, Midland, Mich.). PDMS stamps can be formed, for example, by dispensing an uncrosslinked PDMS polymer into or against a patterned mold, followed by curing. The patterned features can be, for example, millimeter-sized, micrometer-sized, nanometer-sized, or a combination thereof.

The master tool for molding the elastomeric stamps can be generated by preparing a patterned photoresist using photolithography as known in the art. The elastomeric stamp can be molded against the master tool by applying uncured PDMS to the master tool and then curing.

Microcontact printing can be carried out by using a relief-patterned stamp or printing plate made of elastomer in combination with a substantially flat substrate in order to transfer to the substrate a patterned self-assembled monolayer (SAM) according to the relief pattern of the stamp or plate. Alternatively, microcontact printing can be carried out by using a substantially flat stamp or printing plate made of elastomer in combination with a relief-patterned (or structured or micro-structured) substrate (for example, a coated polymer film with embossed surface structure on a major surface) in order to transfer to the substrate a patterned self-assembled monolayer (SAM) according to the relief pattern of the substrate (as described, for example, in U.S. Patent Application Publication No. 2008-0095985-A1 (Frey et al.), the description of which is incorporated herein by reference).

The "ink" comprises molecules capable of forming a self-assembled monolayer. Various molecules that form a self-assembled monolayer (SAM) are known such as organosulfur compounds, organosilanes and organophosphonic acids. Organosulfur compounds include for example alkylthiols, dialkyl disulfides, dialkyl sulfides, alkyl xanthates, dithiophosphates, and dialkylthiocarbamates. The molecules are characterized by a tail group or groups attached to a sulfur atom, wherein the tail group or groups have between 14 and 20 atoms along their backbone, preferably 16, 17, or 18 atoms. The atoms along the backbone are preferably carbon atoms.

Preferably the ink solution comprises alkyl thiols such as, for example, linear alkyl thiols:

$$HS(CH_2)_nX$$

where n is the number of methylene units and X is the end group of the alkyl chain (for example, X=—$CH_3$, —OH, —COOH, —$NH_2$, or the like). Preferably, X=—$CH_3$ and n=15, 16, or 17, corresponding to chain lengths of 16, 17, or 18, respectively. Other useful chain lengths include 19 and 20. For linear molecules bearing a sulfur-containing head group for attachment to a metal, the chain length is determined as the number of atoms along the linear arrangement of bonded atoms between and including the atom that is bonded to the sulfur atom and final carbon atom in the linear arrangement. The monolayer-forming molecule may comprise other end groups or be branched (e.g. with side groups) provided that the molecule is suitable to form a self-assembled monolayer that functions as an etch resist. The SAM-forming molecules may also be partially fluorinated or perfluorinated, for example as described in Provisional U.S. Patent Application Ser. No. 61/121,605, filed Dec. 11, 2009.

As is known in the art, such printing can include a displacement reaction that results in removal or modification of an atom or functional group in the SAM-forming molecules (for example, conversion of a thiol (R—SH compound) to a thiolate (R—S-M) monolayer when the monolayer is formed on a metal (M), for example silver or gold). Thus, the resulting printed pattern can comprise compounds or molecules that are chemically different from the molecules of the ink composition.

Optionally, but preferably, the ink compositions can further comprise at least one solvent.

Suitable solvents for use in the ink compositions include alcohols, ketones, aromatic compounds, heterocyclic compounds, fluorinated solvents, and the like, and combinations thereof. Other useful solvents include dimethylformamide, acetonitrile, dimethylacetamide, dimethylsulfoxide, ethyl acetate, tetrahydrofuran (THF), methyl t-butyl ether (MTBE), and the like, and combinations thereof.

Preferably, the solvent of the ink composition can be selected so as to evaporate relatively rapidly from the stamp surface, as this can also be helpful for achieving a relatively uniform distribution of the SAM forming molecules on or within the stamp with a minimum of time and application of forced air. The solvents are chosen such that the solvent does not excessively swell the (e.g. PDMS) stamp.

The ink compositions can comprise relatively small amounts of common additives (for example, stabilizers or desiccants), if desired, as known in the art.

The stamp can be "inked" with a composition comprising molecules capable of forming a SAM using methods known in the art.

In one method, an applicator (for example, a cotton swab or a foam applicator) impregnated with the ink composition can be rubbed across the relief-patterned surface of the stamp, followed by drying of solvent from the stamp surface. In another approach, the stamp can be pressed against an "ink pad" impregnated with the ink composition, the ink pad optionally being a PDMS slab. In another approach, the stamp can be charged with ink composition from its back side, relative to the printing surface. In this latter approach, the molecules diffuse through the stamp to reach the relief-patterned face for printing. Alternatively, the relief-patterned printing face of the stamp can be immersed in the ink, followed by withdrawal and drying ("immersive inking"). All of the above described methods of inking render the relief-patterned stamp surface inked, yielding an "inked surface."

The inked stamp can be used to transfer a pattern to the metalized surface of the substrate to form at least one SAM patterned region and (e.g. adjacent) unpatterned regions on the metalized surface. When the inked surface of the stamp comprises a relief pattern, the inked surface can be contacted to a surface of a substrate that is essentially flat in order to transfer a pattern of the SAM forming molecules to the metalized surface of the substrate, wherein the pattern of the SAM molecules is essentially the same as the pattern of raised features in the relief pattern of the inked surface of the stamp. In such a process, the pattern is said to be transferred according to the relief pattern of the inked surface of the stamp. Alternatively, the inked surface of the stamp (or, alternatively, a printing plate) may be essentially flat, with the substrate comprising the relief pattern. Such "reverse" microcontact printing process is described for example in U.S. Pat. No. 6,518,168 (Clem et al.).

The inked stamp can be placed in contact with the surface of the substrate such that contact is made with the raised regions of the relief-patterned surface of the stamp. The molecules can diffuse from the stamp onto the surface of the substrate where they can form a SAM.

The printing time (that is, the duration of contact between the stamp and the substrate) can vary, depending upon factors including, for example, the concentration of the ink composition and the pressure applied to the stamp. In some embodiments, the print time can be less than 1 minute (preferably, less than about 30 seconds; more preferably, less than about 10 seconds; most preferably, less than about 5 seconds).

The SAM patterned substrate can be used as a resist that protects the underlying substrate surface during a subsequent etching step. Thus, it can serve as an etch mask that protects against the action of an etchant, while the other region(s) (i.e. lacking the patterned monolayer) on the surface of the substrate are not protected, allowing selective removal of material (for example, metal) in the exposed region(s).

Wet etching of the substrate is typically carried out by use of an etchant bath comprising an etchant solution. The etching of the exposed region is selective, i.e. without significant etching of the surface regions comprising the SAM pattern. In some embodiments, less than about 50% by mass of the metal in the SAM patterned regions is removed via wet etching per unit area. In preferred embodiments, less than about 25% by mass, less than about 10% by mass, or less than about 5% by mass of the metal in the SAM patterned regions are removed via wet etching per unit area. This can be determined by using known methods such as transmitted light attenuation, profilometry, mass analysis, or the like.

Useful chemical etching baths can be prepared by dissolving etchant species in water or a non-aqueous solvent (for example, with agitation or stirring, control of pH, control of temperature, and/or replenishment of etchant species upon their consumption, according to the nature of the etchant).

Without intending to be bound by theory or mechanisms, the following discussion relates to selection of etchants.

The etchant bath typically comprises at least one oxidizing agent. The oxidizing agent, particularly for etching silver or gold, can be a relatively small molecule oxidizing agent, typically have a molecular weight of less than about 200 g/mole. Suitable small molecule oxidizing agents include for example cyanide ions in the presence of dissolved oxygen, ferricyanide ions, and ferric ions.

The etchant bath also typically comprises at least one metal complexing compound such as thiourea ($NH_2$)$_2$CS or a thiourea derivative (i.e. a class of compounds with the general structure ($R^1R^2N$)($R^3R^4N$)C=S wherein $R^1$, $R^2$, $R^3$, $R^4$ each are independently hydrogen atoms or some organic moiety such as ethyl or methyl). Thiourea and thiourea derivatives are related to thioamides e.g. RC(S)$NR_2$, where R is methyl, ethyl, etc. In some embodiments, a small molecule metal complexing compound, also having a molecular weight less than about 200 g/mole is employed.

Thiourea-based etchants with ferric ions as an oxidizing species are generally preferred etchant solutions, particularly for etching silver or gold.

The concentration of oxidizing species (e.g. ferric nitrate) is typically at least 1 mM or 5 mM and no greater than 500 mM or 250 mM. In some embodiments, the concentration of oxidizing species (e.g. ferric nitrate) is at least 10 mM, 15 mM, or 20 mM and no greater than 100 mM or 50 mM.

In some embodiments, the etchant comprises oxidizing species in the absence of a metal complexing compound, such as thiourea. In other embodiments, a metal complexing compound (e.g. thiourea) is present in the etchant bath at a concentration of at least 1 mM or 5 mM and no greater than 250 mM or 100 mM. In some embodiments, the concentration of metal complexing compound (e.g. thiourea) is at least 10 mM or 15 mM and no greater than 100 mM.

The etchant may also comprise self-assembling monolayer forming molecules. However, good pattern feature uniformity, increased metal pattern thickness, or a combination thereof were obtained using a liquid etchant that is free of self-assembling monolayer forming molecules.

The etchant is generally added to the etchant bath and circulated. The concentration may be monitored and adjusted to maintain a constant concentration for the duration of the etching.

The invention is not limited with regard to the physical mechanism (e.g. bubbler apparatus) that is used for agitating the etchant solution with bubbling gas while the etchant is in contact with a SAM-patterned substrate. Depending on the etchant formulation and the metal, suitable gasses may include air, nitrogen, oxygen, argon, carbon dioxide, or carbon monoxide.

Although the method will be described in greater detail with respect to one type of apparatus, i.e. a gas dispersion fritted disc, bubbling gas agitation could alternatively be provided by other means. For example, bubbling gas agitation may be provided by boiling (as activated by heating or by reducing ambient pressure) or with cavitation, wherein an ultrasonic transducer (e.g., an ultrasonic horn) or an array of ultrasonic transducers may be submerged in the etchant bath and oriented such that bubbles rise and impinge upon the SAM-patterned substrate that is in contact with the etchant bath.

Agitation by bubbling gas can also be provided by shearing a stream of gas that is made to flow into the liquid etchant bath. For example, a stream of gas or a series of large bubbles emerging from a single orifice can be dispersed with a rotor, for example a spinning rotor comprising blades on the end of a shaft. In another approach to shear dispersion of bubbles, a rotor (for example a bladed rotor on a shaft or a magnetic stir bar) can be made to entrain ambient gas (e.g., air) and shear that gas into bubbles.

With reference to FIG. 1, a general schematic of a method of agitating a liquid etchant with bubbling gas, a (e.g. gas dispersion fritted disc) gas bubbler 130 is immersed in an etching solution 120. The bubble generating surface 131 (e.g. of the fitted disc) generally comprises small openings (i.e. pores not shown) formed as the result of a partial sintering process for particles (e.g., fritted glass or powder metallurgy product) or by machining a solid material (e.g., laser perforation or electro discharge machining). A tube 140, connected to a source of compressed gas, for example an air compressor (not shown), forces air through the openings emitting bubbles into the liquid etchant. The gas (e.g., air) pressure can be controlled by a gas regulator and the air flow rate can be monitored (and controlled, as in the case of a rotameter with integrated needle valve) by the flow meter. One suitable gas dispersion fritted disc is available from Sigma-Aldrich, catalog number CLS3952530C. Such gas bubbler has an angle of 90° between the gas feed tube and the bubble generating surface of the fitted glass disc.

Bubbles emitted from a bubble generating surface move (e.g. ascend) through the etchant bath in a direction 132 substantially normal to the metalized surface. The bubbles impinge upon the SAM printed metalized surface.

In one embodiment, the metalized substrate surface comprising the patterned SAM 110 is preferably positioned substantially parallel to the bubble generating surface. In doing so, the center region and edge regions of the SAM patterned substrate are about equidistance from the bubble generating surface.

The pattern feature uniformity and the etch rate can be affected by a number of factors.

In some embodiments, it has been found that when the bubble generating surface, such as the gas dispersion glass frit, has a fine pore size (e.g., <20 micrometers), the size of the gas bubbles is generally relatively small (e.g. 0.5 to 1 millimeter) at the surface of the SAM patterned substrate. During etching, some of these tiny gas bubbles can become pinned at certain locations on the metalized substrate. As a result of this pinning phenomenon, the etched surfaces can become heterogeneous and the areas not covered by bubbles etched more rapidly than those areas covered by bubbles. After etching, the unpatterned metal regions covered by the bubbles can remain on the substrate. In contrast, in other embodiments, a (e.g. gas dispersion fritted glass) bubble generating surface with a pore size of at least 40, 50, or 60 micrometers can produce larger bubbles, having a diameter under some conditions of at least about 2 or 3 mm, at the surface of the SAM patterned substrate. In some embodiments, when the openings of the bubble generating surface has a pore size of at least 150, 200, or 250 micrometers, the diameter of the bubbles ranged form about 2 to 4 mm. Such larger bubbles tend to coalesce and remain mobile upon reaching the SAM patterned substrate, rather than becoming pinned. Hence, when the bubble size of the bubbling gas is of a sufficient diameter, the unpatterned etched surface comprises no substantial metal residue caused by bubble pinning. Without intending to be bound by theory, the preferred maximum bubble size is surmised to be approximately 5 mm to 10 mm.

In some embodiments, it has been found that when the distance between the bubble generating surface and the SAM patterned metalized substrate is less than a certain value, for example 20 millimeters, the space for the bubbles to be agitated (e.g. laterally) along and then away from the surface is limited. This can also cause some gas bubbles to become pinned at certain locations on the surface of metalized substrate. In some embodiments, when the distance between the SAM patterned surface and bubble generating surface was increased, e.g. to at least 50 millimeters (e.g. for a 7.5×7.5 cm sample), substantially no metal residue associated with pinned bubbles was observed. Hence, the distance between the surface of the bubbling generating surface (e.g. of the fritted disc) and the SAM patterned surface of the substrate is typically at least 10 millimeter. In some embodiments, the distance is greater than 20 millimeter, and more typically at least 30 millimeter, 40 millimeter, or 50 millimeters.

The size of the bubble generating surface (e.g. of the fitted disc) and the liquid etchant vessel can be selected based on the sample size of the SAM patterned substrate. The vessel is sufficiently large enough to accommodate the substrate. The size of the bubble generating surface is preferably at least about 1/10 to 1/8 of the size of the SAM patterned area of the substrate. For example, the size of the bubble generating surface (e.g. of the gas dispersion fritted disc) is preferably at least about 3 cm in diameter (bubbler surface area equals 7.1 square centimeters) for a 7.5 cm×7.5 cm SAM patterned substrate (substrate area equals 56.25 square centimeters). When the surface area of the bubble generating surface is insufficient relative to the SAM patterned metalized surface being etched, the etchant is not uniformly agitated. Rather, the gas bubbles primarily agitate the middle region of the etchant bath. This can result in the middle region of the SAM patterned metalized substrate being etched more rapidly than the edge region. In order to have uniform agitation throughout the etchant bath is also preferred that the geometry of the bubble generating surface is similar to the geometry of the vessel. Hence, whereas a circular shaped bubble generating surface is preferred for a cylindrical etchant bath vessel; a rectangular shaped bubble generating surfaces is generally preferred for a rectangular shaped etchant bath in order to have uniform agitation throughout the etchant bath.

The surface velocity is the volumetric air flow rate for the bubbles (volume per unit time) divided by the cross sectional area of the zone of rising bubbles. For a flat fritted glass bubbler for example, the cross sectional area of the zone of rising bubbles is approximated as the projected area of the bubbler surface that emits bubbles (pores plus any material between pores) onto a plane normal to the bubble flow direction. When the air flow rate is low, there are fewer bubbles per unit time and the velocity of the bubbles as the bubbles are emitted from the bubble generating surface is relatively slow. However, even with a surface velocity of only about 10 cm/min, the etch rate can at least double in comparison to the observed rate when no bubbling gas agitation at all is used. Further a surface velocity of about 50 cm/min can at least triple the etch rate (e.g. to at least 100 nm/min). When the air flow rate is high, more bubbles are generated per unit time and the velocity of the bubbles is faster. The higher velocity is amenable to continuous circulation of the etching solution. In some embodiments, the % bubble coverage at the SAM patterned metalized substrate surface is typically at least 30%, 40% or 50% and typically no greater than about 70 percent. However, due to increase velocity of the bubbles, the bubbles either coalesce upon colliding with the SAM patterned substrate surface or are swept away (e.g. laterally) from the surface, thereby preventing the bubbles from being pinned and retained on the SAM patterned metalized surface.

The etch rate has been found to increase with increasing surface velocity (e.g. as created by increasing volumetric air flow rate) until the velocity reaches about 100 cm/min to 150 cm/min. Thereafter, for some etching setups, increasing the air flow and velocity does not substantially further increase the etch rate. When the velocity is in excess of about 340 cm/min and the sample size is relatively small (e.g. <10 centimeters×10 centimeters), the bubbles can lift an unsupported SAM patterned metalized substrate upward and away from the etchant bath chemistry. This can also result in non-uniform etching.

It is appreciated that the distance between the bubble generating surface and the SAM patterned metalized substrate maximum as well as the velocity of the bubble when emitted form the bubble generating surface could be considerably higher for larger sized substrates and still fall within the scope of the invention.

The etchant bath may be agitated with bubbling gas in combination with agitation provided by another method. For example, the etchant bath may additionally be agitated such as provided by stirring, flowing, and/or ultrasonically activating the etch bath. Unlike cavitation, ultrasonic activation employs relatively low amounts of ultrasonic energy and thus does not necessarily generate appreciable bubbling. Alternatively or in combination thereof, the movement of the substrate may provide additional agitation such as provided by shaking, translating, rotating, and/or vibrating the substrate.

With sufficient agitation, as can be provided by use of agitation with bubbling gas as described herein, the etch rate in the thickness direction for a metal coating, particularly for gold and silver can exceed 300 nm/minute. As used herein, etch rate refers to the average etch rate given by dividing the thickness of metallization by the time required for the etchant to remove the metal.

Once the metal of the unpatterned regions has been removed, the etchant (e.g., the oxidizing agent and metal complex forming molecule) is typically washed away from the surface of the etched microcontact printed metal pattern. Although it is intended to completely remove the etchant, it is not uncommon for very small concentrations of the wet etchant components to remain. The presence of such wet etchant components can be determined by various quantitative and/or qualitative analysis such as surface-enhanced Raman scattering, X-ray photoelectron spectroscopy, Auger electron spectroscopy, secondary ion mass spectrometry, and reflectance infrared spectroscopy.

The method described herein can be conducted batch-wise or in a continuous process.

The etched SAM-patterned metal pattern (corresponding to the raised features) can include a variety of patterns. The conductive patterns or pattern regions are generally contiguous and electrically conductive in the plane of the pattern.

Preferred (e.g. conductive) patterns include regions with two dimensional meshes, e.g. square grids, rectangular (non-square) grids, or regular hexagonal networks, where conductive pattern features such as patterned lines define enclosed open areas within the mesh. The open spaces defined by the metal patterns can be defined as cells. Other useful geometries for mesh cells include random cell shapes and irregular polygons.

The patterns can be described with reference to the total surface area of open spaces. In some embodiments, the pattern has an open area of at least 60%, 70%, 80%, 90%, 91%, 92%, 93%, 94%, or 95%. In preferred embodiments, the pattern has an open area of at least 96%, 97%, or 98%. The remainder is the total surface area of the patterned metal.

The width of the patterned features can vary depending on the pattern selection. For (e.g. hexagonal) open meshes, the line width is typically at least 0.5 microns and no greater than 20 microns. In some embodiments, the patterned feature (e.g. line width) ranges from 1 to 5 micrometers.

The method described herein is amenable to producing patterned articles comprising an etched microcontact printed metal pattern good pattern uniformity for an area of at least 25 $cm^2$. In some embodiments, the etched microcontact printed metal pattern exhibits good pattern uniformity for an area of at least 100 $cm^2$, in some embodiments at least 150 $cm^2$, and in yet other embodiments at least 200 $cm^2$.

The uniformity of a pattern feature can be evaluated according to various methods. As described in the forthcoming examples, the pattern feature uniformity as described herein is determined by measuring the (e.g. shortest) dimension of a repeating pattern feature from the middle region (e.g. at or near the center) of the metal pattern and measuring the dimension of that (i.e. same) repeating pattern feature at an edge region (e.g. at or near the perimeter) of the pattern. For example, when the pattern comprises an array of linear pattern features forming a metal mesh pattern such as open (e.g.

hexagonal) cells the line width of traces that defines the edges of cells from the middle region of the patterned substrate can be subtracted from the line width of cells from an edge region. If there is no difference in pattern (e.g. line width) feature dimension, the pattern feature uniformity is 100%. The difference between the dimensions of the pattern features can be used to calculate a pattern feature uniformity (% Uniformity) according to the equation:

% Uniformity=(1−(Absolute Value of Difference in Feature Dimension Between Middle Region and Edge Region/(Greater of the Feature Dimensions for the Middle Region and Edge Region)))×100

In some embodiments, such as when the SAM patterned substrate is etched as described herein, the greater feature (e.g. line width) dimension is typically the feature (e.g. line width) dimension at the edge. However, the greater feature (e.g. line width) dimension can also be the middle (e.g. line width) dimension.

The uniformity of repeating filled pattern features such as dots and squares can be evaluated in substantially the same manner by measuring area linear dimension of the repeating pattern features (e.g., edge width of a square, diameter of a circular dot).

Particularly for random patterns or patterns that include a variety of different (e.g. cell) designs, the pattern uniformity can alternatively be determined by comparing the metal pattern features to the raised feature (e.g. of the inked stamp) from which the pattern feature were derived from. This is commonly known as the pattern replication fidelity. The aforementioned comparison would be executed for different regions (e.g., edge region vs. middle region) of the substrate.

When the total metal pattern has an area of no greater than about 75 cm$^2$, the pattern feature uniformity throughout the area can generally be determined from comparing a single pattern feature measurement from the middle and edge region. This is especially true for repeating patterns (e.g. having the same design, thickness, and (e.g. line) width) throughout the metal patterned area. However, for larger metal patterned areas and those having multiple designs, a statistically meaningful number of pattern features measurements would be made to arrive at an average pattern feature uniformity. In the case of (e.g. repeating) metal patterned areas having an area greater than 75 cm$^2$ for example, a different procedure can be used to determine the % uniformity. In such cases, more than one pattern uniformity measurement is typically taken, wherein each measurement is separated by a distance of at least about 4 to 5 cm. Further, in the case of patterns having a range of feature dimensions, it is typical to measure the pattern feature uniformity of the smallest pattern features, as these would be the most negatively impacted, on a percentage basis, by undesirable process artifacts that lead to narrowing of features.

In some embodiments, metal patterned articles described herein have a pattern feature uniformity of at least 50%, 60%, 70%, 80%, or 90% for an area of at least 25 cm$^2$. A pattern feature uniformity of at least 95%, 96%, 97%, 98%, 99%, or 100% was obtained for various metal pattern thicknesses. In preferred embodiments, such pattern uniformity can be obtained for even larger total metal patterned areas. The total metal patterned area, particularly of silver or gold, may be at least 50 cm$^2$, 100 cm$^2$, 150 cm$^2$, 200 cm$^2$ or greater.

Conductance of sheet conductors is strongly dependent on metal thickness. To achieve certain conductive properties, patterns with increased metal thickness are required. In some embodiments, metal (e.g. of silver and gold) patterned articles described herein have increased metal pattern thicknesses. For example in some embodiments, the thickness is at least 125 nm, 150 nm, 175 nm or 200 nm. In some embodiments, the thickness of a silver or gold metal pattern may be at least 250 nm, 300 nm, 350 nm, 400 nm, or greater. Silver patterns (e.g. that also exhibit good uniformity) may have a thickness of at least 500 nm, 600 nm, 700 nm, 800 nm, 900 nm, 1000 nm, or greater.

The methods and embodiments described here are particularly useful for achieving etched SAM-patterned metal patterns with the aforementioned thickness values and with the aforementioned pattern feature uniformity values.

Increasing the thickness of the metal pattern is also amenable to narrower in-plane feature dimensions such as line width and/or lower area fraction coverage, for a given target level of conductance along the line. For example, a mesh pattern having a 2 micrometer line width and 98% metal coverage has the same sheet resistance as a 1 micrometer line width and 99% metal coverage if the metal thickness is increased from 100 to 200 nanometers, respectively. Reducing the line width and/metal coverage is amenable to improved optical properties such as higher light transmission and lower haze for low density mesh patterns.

Objects and advantages of this invention are further illustrated by the following examples, but the particular materials and amounts thereof recited in these examples, as well as other conditions and details, should not be construed to unduly limit this invention. These examples are merely for illustrative purposes only and are not meant to be limiting on the scope of the appended claims.

Preparation of Metalized Polymer Film Substrates

Metalized polymer film substrates were prepared by thermal evaporation of metal onto 5 mil polyethyleneterephthalate "PET" (ST504, E.I. DuPont de Nemours and Company, Wilmington, Del.). For the silver-coated substrates, the substrate surface was coated with 30, 60, 100, and 125 nanometers of silver; 30 angstroms of chromium and then coated with 200, 500, 700, 1000 nanometers of silver; or 30 angstroms of titanium and then coated with 300 and 400 nanometers of silver.

The gold-coated substrate was first coated with 30 angstroms of chromium and then coated with 400 nanometers of gold.

Stamp Fabrication

Figure 3:
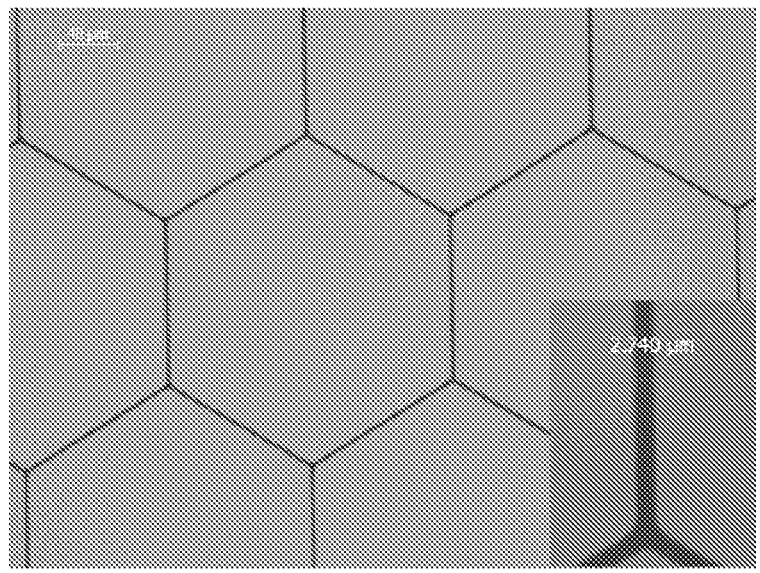
FIG. 3 is an optical photomicrograph of a center region of an etched microcontact printed metal pattern.

For Examples 1-10 and C1-C4, a first master tool for molding elastomeric stamps was generated by preparing patterned photoresist (Shipley1818, Rohm and Haas Company, Philadelphia, Pa.) on 10-centimeter diameter silicon wafers using photolithography. The master tool had a pattern of photoresist disposed thereon comprising trenches (photoresist material removed) in the pattern of a hexagonal mesh of lines. FIG. 3 is an optical photomicrograph of a region of a completed pattern (thin film silver on PET), illustrating generally the geometry of low-density mesh region (hexagonal cell geometry with 97 percent open area and 3 micrometer wide lines forming hexagons).

An elastomeric stamp was molded against the master tool by pouring uncured polydimethylsiloxane (PDMS, Sylgard™ 184, Dow Corning, Midland Mich.) over the tool to a thickness of approximately 3.0 millimeters. The uncured silicone in contact with the master was degassed by exposing to a vacuum, and then cured for 2 hours at 70° C. After peeling from the master tool, a PDMS stamp was provided with a relief pattern comprising raised features approximately 1.8 micrometers in height. The raised features of the stamp were the lines defining the respective mesh geometry. The stamp was cut to a size of approximately 7 by 7 centimeters. This stamp is referred to as "Stamp 1".

For Example 11, a second master tool was prepared similarly to the first master tool, except that the pattern of photoresist was disposed on a plate of glass. The pattern of photoresist included the similar geometric elements (hexagonal mesh) described above for the first master tool, except that hexagonal cell geometry has 98 percent open area and 2 micrometer wide lines forming hexagons. The stamp was cut to a size of approximately 15 by 15 centimeters. This stamp is referred to as "Stamp 2".

Inking

Stamp 1 was inked by contacting its back side (flat surface without relief pattern) to a solution of 5 mM octadecylthiol ("ODT" 00005, TCI AMERICA, Wellesley Hills, Mass.) in ethanol for 20 hours.

For Example 11, Stamp 2 was inked by contacting its back side (flat surface without relief pattern) to a solution of 10 mM octadecylthiol in ethanol for 20 hours.

Stamping

Metalized polymer film substrates were stamped with the described inked stamp. For stamping, the metalized film was contacted to the stamp relief patterned-surface, which was faced up, by first contacting an edge of the film sample to the stamp surface and then rolling the film into contact across the stamp, using a roller with diameter of approximately 3.0 centimeters. The rolling step required less than 5 second to execute. After the rolling step, the substrate was contacted with the stamp for 10 seconds for Stamp 1 and 15 second for Stamp 2 (of Example 11). Then, the substrate was peeled from the stamp, a step that required less than 1 second.

Etching

After stamping, the metalized film substrate with the SAM-printed pattern was placed in the etch bath for selective etching and metal patterning.

For Examples 1-6 and C1-C4, an etchant solution was prepared by combining 2.25 grams of thiourea (T8656, Sigma-Aldrich, St. Louis, Mo.), 8.2 grams of ferric nitrate (216828, Sigma-Aldrich, St. Louis, Mo.), and 1000 milliliter of deionized water.

For Examples 7-10, the etchant was prepared by combining 4.5 grams of the thiourea, 16.4 grams of the ferric nitrate, and 1000 milliliter of deionized water.

For Example 11, the etchant comprised 9.0 grams of the thiourea, 32.8 grams of the ferric nitrate, and 4000 milliliters of deionized water.

For Examples 1-11, the samples were etched in an etchant bath having bubbling agitation, as depicted in FIG. 1. The temperature of the etching solution was 21° C. One of two different gas bubblers was immersed into the etching solution and situated on the bottom of the beaker. The bubblers were all of a fritted glass disc type. In each case, the bubbler feed tube was connected with an air supply through a flow meter. The air pressure was controlled by a gas regulator and was set at 8 psi. The air flow rate was monitored by the flow meter (LINDE FM 4334, Union Carbide, New York, bought by Dow Chemical in 1999). The SAM-printed metalized substrate was placed on the surface of the etching solution with metal side facing down (floating atop the etchant bath, as caused by surface tension). The distance between the surface of the fritted disc and the surface of the substrate was 70 millimeters (i.e., the travel distance of gas bubbles from the bubbler to the substrate surface was 70 millimeters). The gas bubbles were generated through the gas dispersion fritted disc and flowed up to hit the metal surface for agitating the etch process. Gas bubbles travelled in a direction generally normal to the surface of SAM-printed metalized substrate and were provided continuously.

Examples 1-10, samples with a size less than 7 centimeters by 7 centimeters, employed 1 liter of etching solution in a 2 liter beaker (i.e. 14 centimeters in diameter) as an etchant bath. A gas dispersion fritted disc with a pore size of 40~60 micrometers and a disc diameter of 30 millimeters was used to generate gas bubbles, and the flow rate was set at 1100 cc/min (i.e. 155.7 cm/min face velocity). The bubble size at the substrate surface was about 2 to 3 millimeters. The bubble density at the substrate surface was estimated to be about 70%. The velocity of the rising bubbles was greater than 40 cm/s.

For Example 11, having a sample size of 15 centimeters by 15 centimeters, 4 liters of etching solution in a cylindrical etch bath (25 centimeters in diameter and 25 centimeters in height) was utilized. A gas dispersion fritted disc with a pore size of 170~220 micrometers and a disc diameter of 10 centimeters was used to generate gas bubbles, and the flow rate was set at 12222 cc/min (i.e., 155.7 cm/min face velocity). The bubble size at the substrate surface was about 2 to 4 millimeters. The bubble density at the substrate surface was estimated to be higher than 80%. The velocity of the rising bubbles was greater than 40 cm/s.

In the case of Comparative Examples (C-1, C-2, and C-3), 1 liter of etching solution was provided in a 2 liter beaker as the etchant bath. The etching solution was stirred with a (8 centimeter in length and 1.3 cm in diameter) magnetic stir bar at a rate of about 260 rpm. The sample was immersed into the solution and positioned vertically along the wall of the beaker.

Test Methods

Etch Time

The etch time was recorded by VWR Big-Digit Stopwatch. The average etch rate of each sample was calculated by dividing the metal thickness by the etch time.

Pattern Uniformity

After selective etching and metal patterning, the metal patterns were characterized using an optical microscope (Leica DFC 420, Leica Microsystems Inc., Bannockburn, Ill.). The microscopic techniques were used to determine the width of line features of the metal pattern. The pattern feature uniformity was determined as previously described.

EXAMPLES 1-11 and C1-C3

Hexagonal mesh pattern of thin film metal were fabricated and characterized as described above. The metal thickness, etch times, etch rate, line width at the edge and middle of the sample as well as the etch uniformity are reported in following Table 1 and 2.

Figure 2:
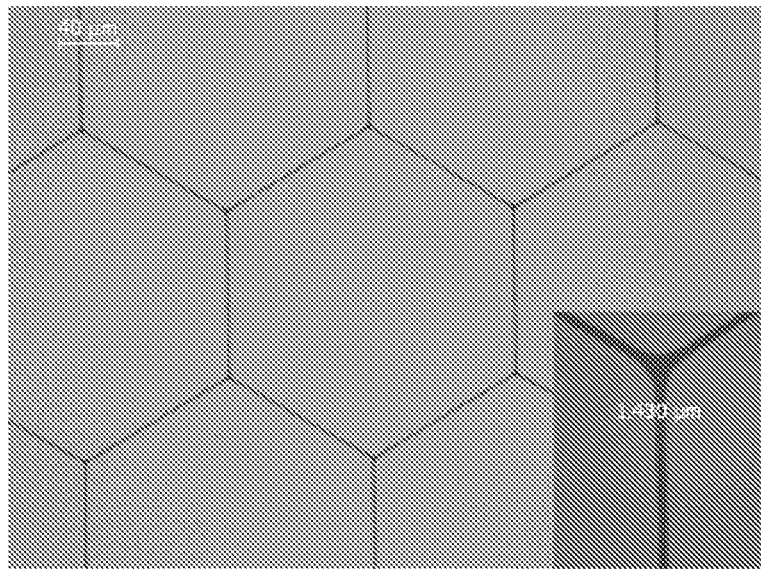
FIG. 2 is an optical photomicrograph of an edge region of an etched microcontact printed metal pattern.

FIG. 2 is an optical photomicrograph of Example C-3, illustrating the line width at the edge region of the metalized pattern.

FIG. 3 is an optical photomicrograph of Example C-3 illustrating the line width at the center region of the metalized pattern.

Example C-4 was prepared in the same manner as Example C-1, except the following differences. The thickness of thin film silver was 100 nanometers. After stamping, the silver substrate (7.5 cm×7.5 cm) with printed pattern was placed on the surface of the etching solution with metal side facing down. The etching solution was stirred with a magnetic stirring bar at a rate of 260 revolution per minute for agitating the etch process. After 1 minute and 30 seconds of etching, the edge region of the sample was completely etched, but the middle region of the sample remained unetched because vortex formed in the etching solution at this stirring speed, causing the etchant solution not to contact the metalized and SAM printed substrate surface in the middle region of the sample.

TABLE 1

Processing Conditions

| Example No. | Metal Type | Agitation Method | Metal Thickness | Etch Time (sec) | Etch Rate (nm/min) |
|---|---|---|---|---|---|
| 1 | Ag | Bubbling | 30 nm | 15 | 120 |
| 2 | Ag | Bubbling | 60 nm | 30 | 120 |
| 3 | Ag | Bubbling | 100 nm | 50 | 120 |
| 4 | Ag | Bubbling | 200 nm | 90 | 133 |
| 5 | Ag | Bubbling | 300 nm | 120 | 150 |
| 6 | Ag | Bubbling | 400 nm | 150 | 160 |
| 7 | Ag | Bubbling | 500 nm | 110 | 260 |
| 8 | Ag | Bubbling | 700 nm | 135 | 311 |
| 9 | Ag | Bubbling | 1000 nm | 180 | 333 |
| 10 | Au | Bubbling | 400 nm | 390 | 61 |
| 11 | Ag (6" × 6") | Bubbling | 125 nm | 75 | 100 |
| C-1 | Ag | Stirring | 30 nm | 30 | 60 |
| C-2 | Ag | Stirring | 60 nm | 60 | 60 |
| C-3 | Ag | Stirring | 100 nm | 90 | 66 |

TABLE 2

Metal Patterned Substrate Characterization

| Example No. | Metal Type | Agitation Method | Metal Thickness | Line Width (μm) Middle | Line Width (μm) Edge | Absolute Value of Difference in Pattern Feature Dimension* (μm) | % Uniformity |
|---|---|---|---|---|---|---|---|
| 1 | Ag | Bubbling | 30 nm | 3.69 | 3.69 | 0 | 100% |
| 2 | Ag | Bubbling | 60 nm | 3.81 | 3.81 | 0 | 100% |
| 3 | Ag | Bubbling | 100 nm | 3.57 | 3.69 | 0.12 | 96.7% |
| 4 | Ag | Bubbling | 200 nm | 3.33 | 3.34 | 0.01 | 99.7% |
| 5 | Ag | Bubbling | 300 nm | 3.34 | 3.46 | 0.12 | 96.5% |
| 6 | Ag | Bubbling | 400 nm | 3.46 | 3.57 | 0.11 | 96.9% |
| 7 | Ag | Bubbling | 500 nm | 3.81 | 3.93 | 0.12 | 96.9% |
| 8 | Ag | Bubbling | 700 nm | 3.84 | 4.01 | 0.17 | 95.8% |
| 9 | Ag | Bubbling | 1000 nm | 3.69 | 3.81 | 0.12 | 96.9% |
| 10 | Au | Bubbling | 400 nm | 3.57 | 3.57 | 0 | 100% |
| 11 | Ag (6" × 6") | Bubbling | 125 nm | 2.15 | 2.26 | 0.11 | 95.1% |
| C-1 | Ag | Stirring | 30 nm | 3.93 | 3.69 | 0.24 | 93.9% |
| C-2 | Ag | Stirring | 60 nm | 3.10 | 2.38 | 0.72 | 76.8% |
| C-3 | Ag | Stirring | 100 nm | 2.74 | 1.43 | 1.31 | 52.2% |

*Absolute Value of Edge Line Width − Middle Line Width|
% Uniformity = (1 − (Absolute Value of Difference in Feature Dimension Between Middle Region and Edge Region/ (Greater of the Feature Dimensions for the Middle Region and Edge Region))) × 100

Continuous Etching Utilizing a Roll-to-Roll Process

Metalized polymer film substrates were prepared by sputter coating silver on polyetyleneterephthalate "PET" films (obtained from E.I. DuPont de Nemours Company, Wilmington, Del. under trade name TEIJIN ST504) in a R2R system. The polymer film substrates were coated to a thickness of 70 nanometers of silver or 120 nanometers of silver. The silver coated films were then printed with a self-assembling molecular (SAM) layer in a pattern according to methods described in US2009/218310.

For the etching experiments, the etching solution consisted of 0.05M Ferric Nitrate (ACS reagent grade, obtained from GFS Chemicals, Powell, Ohio) and 0.1M Thiourea (ACS reagent grade, obtained from GFS Chemicals, Powell, Ohio) in deionized water. An aqueous processing unit (ASI Model 1024, commercially available from Eidschun Engineering, Clearwater, Fla., USA) equipped with an unwind station, a series of idlers configured to present the web in a face down orientation just under the liquid surface level within the processing unit and a winding unit was used. The winders and unwinders used were similar to those commercially available form Northfield Automation, Northfield, Minn. The processing system (with multiple sumps and cavities) was modified mechanically to provide a partial immersion web path, allowing entry into and out of each sump or cavity. The main cavity allowed for 15 cm center-to-center spacing of the rollers in the immersion configuration. The rollers were 7 cm in diameter. The approximate length of web immersed was 22.5 cm. The mechanical modifications allowed the connection of a web system within each internal section of the system including the entry, main sump cavity, first rinse cavity, and drying section. The connection was created by attaching threaded pipe to the lower fluid delivery manifold inlets and the spray bar hangars on the side plate opposing the inlet from the manifold. The system was setup to provide bath agitation within the sump using 3 sparging tubes and one spray bar set at the top center of the main sump cavity (~132 L). The sparging tubes were connected to the lower manifold to keep from having static portions of the sump. The sparging tubes keep all the fluid agitated and the volume relatively homogeneous. The sparging tubes are polyproylene ½" OD tubing fed, there are three. One pointed to each far corner of the sump (2) and one used to move the fluid toward the recirculating pump. The visible backwash from the farside of the sump exhibited good mixing across the whole sump. The spray bar on top was only used to move fluid through the sump cavity, no etching from the spray bar was likely since it is directed at the uncoated side of the web. All other manifold inlets were blocked off to prevent further flow. At the bottom of the first partially immersed idler, an Exair air knife (45 cm long, model#110018, 316 stainless steel, commercially available from Exair, Inc., Cincinnati, Ohio) was set sideways, allowing the air jet to be passed down-web and horizontally while the web was in motion. The air knife was affixed to the already present stainless hardware used to cool and heat the sump. It was affixed using nylon zip ties in a temporary fashion. The air knife was laid in a perpendicular orientation to the web path. The first rinse sump incorporated the use of one set of spray bars to aid in an agitated rinse presented onto the backside of the web after leaving the etch sump and the web was immersed in the rinse solution to rinse the front side or patterned side of the web.

114 L (30 gallons) of DI water was added to the main sump and approximately 72 L (19 gallons) of DI water was added to the first rinse sump. 1008 grams of thiourea was added to 11.4 L (3 gallons) of DI water in a 19 L (5 gallon) bucket and dissolved offline for several minutes with the aid of a magnetic stir station, resulting in a concentrated solution of thiourea. 2676 grams of ferric nitrate was added to 7.5 L (2 gallons) of DI water in a 19 L (5 gallon) bucket and dissolved with the aid of periodic manual agitation, resulting in a concentrated solution of ferric nitrate. The sump was maintained at a constant temperature of approximately 24° C. The silver coated film web with the SAM-printed pattern was set on the core chuck of the unwind station and spliced to the previously unwound web material. The thiourea concentrate was added to the main sump and allowed to mix for 15 minutes using the pumping system available with the system. After mixing for 15 minutes, the ferric nitrate concentrate was added and allowed to mix via recirculation for 15 minutes. The web feed was initiated, the bubbles were turned on with an approximate air flow of 40 Lpm, observed via a Dwyer flow meter (Dwyer Instruments, Inc., Michigan City, Ind.). The web feed rate for etching was approximately 0.5 meters per minute (MPM) (1.75 feet per minute, FPM) for ~70 nm thick Ag film and 0.4 MPM (1.25 FPM) for ~120 nm thick film. When the bubbles were turned off during continuous transport of the web, there was very little etch on silver, indicating the bubble etching was in fact the primary etching mechanism.

The estimated etch time was 27 seconds for film with 70 nm of silver and 38 seconds for film with 120 nm of silver. The etch rate were 156 nm/min and 189 nm/min for films with 70 nm of silver and 120 nm of silver, respectively. Percentage of etching uniformity for these two samples is 90% as determined by the equation previously described.

What is claimed is:

1. A method of patterning a substrate comprising:
    providing a substrate comprising a metalized surface having a self-assembled monolayer patterned region and unpatterned region; and
    wet etching the metalized surface in a liquid etchant agitated with bubbling gas, the bubbling gas impinging on the metalized surface, to remove metal from the unpatterned region to form a metal pattern.

2. The method of claim 1 wherein the wet etching is at a rate of at least 100 nm/min.

3. The method of claim 1 wherein the self-assembled monolayer patterned region is microcontact printed onto the metalized surface.

4. The method of claim 1 wherein the bubbles have a diameter of at least 2 millimeters at the metalized surface.

5. The method of claim 1 wherein the substrate is provided and wet etched in a continuous process.

6. A method of patterning a substrate comprising:
    providing a substrate comprising a metalized surface having a self-assembled monolayer patterned region and unpatterned region; and
    wet etching the substrate with a liquid etchant to remove metal from the unpatterned region thereby forming a metal pattern having a pattern feature uniformity of at least 70% for an area of at least 25 cm$^2$.

7. The method of claim 6 wherein the wet etching comprises immersing the metalized surface comprising the self-assembled monolayer patterned region in a liquid etchant agitated with bubbling gas.

8. The method of claim 6 wherein the self-assembled monolayer patterned region is microcontact printed onto the metalized surface.

9. The method of claim 8 wherein the self-assembled monolayer patterned region is microcontact printed by providing an inked elastomeric stamp comprising self-assembling monolayer-forming molecules; and
    contacting the inked stamp to a metal coated substrate;
    wherein the elastomeric stamp, the substrate, or a combination thereof has one or more raised features that form the self-assembled monolayer patterned region.

10. The method of claim 6 wherein bubbles emitted from a bubble generating surface move through the liquid etchant in a direction substantially normal to the metalized surface and the bubbles impinge upon the self-assembled monolayer patterned region.

11. The method of claim 10 wherein the metalized surface is positioned at a distance of at least 30 millimeters from the bubble generating surface.

12. The method of claim 10 wherein the bubble generating surface has a surface area of at least about one third of that of the metalized surface comprising the self-assembled monolayer patterned region.

13. The method of claim 10 wherein bubbles emitted from the bubble generating surface have a velocity of at least 10 cm/min.

14. The method of claim 10 wherein the bubbles have a diameter of at least 2 millimeters at the metalized surface.

15. The method of claim 6 wherein the metalized surface comprising the self-assembled monolayer patterned region and unpatterned region is positioned substantially parallel to a bubble generating surface that emits bubbles.

16. The method of claim 6 wherein the monolayer comprises an organosulfur compound.

17. The method of claim 16 wherein the organosulfur compound comprises an alkylthiol.

18. The method of claim 6 wherein the etchant comprises ferric ions.

19. The method of claim 6 wherein the etchant comprises thiourea or a thiourea derivative.

20. The method of claim 6 wherein the metallized surface is selected from silver or gold.

21. A metal patterned article comprising:
    a substrate and an etched microcontact printed metal pattern disposed on the substrate wherein the pattern has a thickness of at least 100 nanometers and a pattern feature uniformity of at least 75% for an area of at least 25 cm$^2$.

22. The metal patterned article of claim 21 wherein the pattern has a pattern feature uniformity of at least 90%.

23. A metal patterned article comprising:
    a substrate and an etched microcontact printed metal pattern disposed on the substrate; wherein the pattern comprises silver or gold having a thickness of at least 250 nanometers and a pattern feature uniformity of at least 50% for an area of at least 25 cm$^2$.

24. The metal patterned article of claim 23 wherein the metal pattern comprises silver having a thickness of at least 1 micron.

* * * * *